(12) United States Patent
Obst

(10) Patent No.: US 8,851,274 B2
(45) Date of Patent: Oct. 7, 2014

(54) SUBSTRATE TREATMENT SYSTEM

(75) Inventor: Henrik Obst, Dresden (DE)

(73) Assignee: Von Ardenne Anlagentechnik GmbH, Dresden (DE)

( * ) Notice: Subject to any disclaimer, the term of this patent is extended or adjusted under 35 U.S.C. 154(b) by 403 days.

(21) Appl. No.: 13/180,944

(22) Filed: Jul. 12, 2011

(65) Prior Publication Data

US 2012/0006656 A1    Jan. 12, 2012

(30) Foreign Application Priority Data

Jul. 12, 2010    (DE) .................. 10 2010 031 245

(51) Int. Cl.
*B65G 13/12*    (2006.01)
*C23C 14/56*    (2006.01)

(52) U.S. Cl.
CPC .............. *C23C 14/56* (2013.01); *Y10S 198/95* (2013.01)
USPC ........................... 198/782; 198/788; 198/950

(58) Field of Classification Search
USPC ......... 198/780, 782, 783, 784, 788, 789, 950; 193/37; 414/217
See application file for complete search history.

(56) References Cited

U.S. PATENT DOCUMENTS

| | | | |
|---|---|---|---|
| 3,867,748 A * | 2/1975 | Miller .......................... | 432/246 |
| 4,343,395 A * | 8/1982 | Lippert et al. ........... | 198/781.02 |
| 4,596,527 A * | 6/1986 | Yamada et al. ............... | 198/779 |
| 5,720,378 A * | 2/1998 | Fasoli .......................... | 198/780 |
| 7,175,018 B2 * | 2/2007 | Helgerson et al. ............ | 198/780 |
| 2009/0022571 A1 * | 1/2009 | Krupyshev et al. ........... | 414/217 |
| 2009/0053016 A1 * | 2/2009 | van der Meulen ............ | 414/217 |
| 2009/0142165 A1 | 6/2009 | Krause et al. | |

FOREIGN PATENT DOCUMENTS

| | | |
|---|---|---|
| DE | 10 2005 016 406 A1 | 10/2006 |
| DE | 10 2005 024 180 A1 | 11/2006 |
| DE | 10 2007 052 524 A1 | 5/2009 |
| DE | 102007058052 A1 | 6/2009 |
| DE | 102008019427 A1 | 10/2009 |
| EP | 1 870 487 A1 | 12/2007 |
| JP | 62230513 A | 10/1987 |
| JP | H0511765 U | 2/1993 |
| JP | H0982775 A | 3/1997 |
| JP | 2005232584 A | 9/2005 |
| JP | 2006237161 A | 9/2006 |
| JP | 2008297584 A | 12/2008 |

OTHER PUBLICATIONS

Haberle, Gregor D.; Haberle, Heinz O.; Transformatoren und Elektrische Mashinen; Zeichenburo des Verlags Europa-Lehrmittel; 1986.
National Examination Report dated Jul. 3, 2013 issued in corresponding Japanese application No. 2011-152687.
Office Action dated Apr. 30, 2014 issued for corresponding Japanese patent application No. 2011-152687.

\* cited by examiner

*Primary Examiner* — James R Bidwell
(74) *Attorney, Agent, or Firm* — Heslin Rothenberg Farley & Mesiti P.C.

(57) ABSTRACT

A substrate treatment system for treating substrates includes a system chamber, delimited by chamber walls, at least one substrate treatment device and a transportation device inside the system chamber. The transportation device has an arrangement of transportation rollers arranged one behind the other in the transportation direction, for vertical or horizontal transportation of substrates. At least a first group of transportation rollers which are arranged immediately one behind the other, each has its own drive device.

13 Claims, 6 Drawing Sheets

SUBSTRATE TREATMENT SYSTEM

CROSS REFERENCE TO RELATED APPLICATIONS

Figure 1:
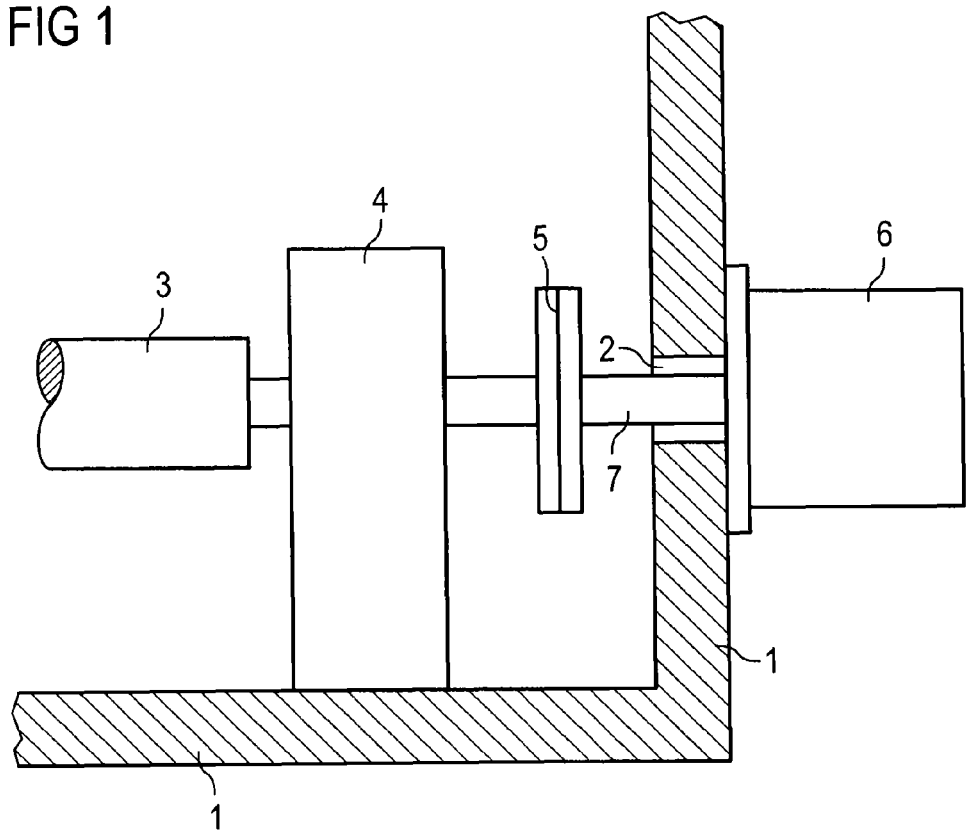

This application is related to commonly assigned, concurrently filed application Ser. No. 13/180,762 and claims priority of German application No. 10 2010 031 245.2-45 filed on Jul. 12, 2010, the entire contents of these applications being hereby incorporated by reference herein.

BACKGROUND ART

The invention relates to a substrate treatment system having a transportation device for transporting substrates.

Typical substrate treatment systems for carrying out substrate treatment operations in a continuous process comprise an elongate system chamber having an entry lock at one end and an exit lock at the other end and also functional regions which are arranged between the locks, for example one or more treatment regions with in each case at least one substrate treatment device, for example a coating device, an etching device, a heating device or the like, one or more pump regions with in each case at least one pump for evacuation or/and for atmospheric separation between functional regions situated upstream and downstream of the pump, transfer regions for transferring the substrates from one functional region to the next functional region etc.

In this case, the functional regions which are defined by their function can form physically independent containers, which are connected to one another to form a system chamber, or can be arranged inside a common container which forms the system chamber. In the latter case, the functional regions can be physically bounded from one another by separating walls which typically have a substrate passage which can be designed as a flow resistor, that is to say as an opening of a size which still just permits the passage of the substrates, or as a valve, for example a check valve, roll valve or slider valve.

In substrate treatment systems of this kind, for example systems for coating or/and for dry-etching plate-like substrates, transportation devices are known, these transportation devices having an arrangement of transportation wheels or transportation rolls on which the substrates are transported in the transportation direction, in a vertical or horizontal position, from the entry lock to the exit lock through the substrate treatment system and, in the process, through the functional regions arranged between the locks. In this case, the substrates can be supported by a substrate holder which is moved by the transportation device or can be moved through the substrate treatment system without a substrate holder, that is to say directly on the transportation device in a horizontal or vertical position.

In this case, a transportation roll is to be understood to mean an elongate, substantially cylindrical body which is rotatably mounted, for example in a typical transportation device for the horizontal (recumbent) transportation of plate-like substrates, at each of the two ends of the transportation device, it being possible for a plurality of transportation rolls to be mounted, for example by way of each end, in a respective bearing support, the bearing supports in each case having the bearings for a plurality of transportation rolls which are arranged one behind the other in the transportation direction of the substrates. A transportation device of this kind is described, for example, in DE 10 2005 016 406 A1.

In contrast, for the purposes of this description, a transportation wheel is intended to be understood to mean a relatively short, substantially cylindrical body (with or without circumferential guide channels) which is rotatably mounted, for example in a typical transportation device for the vertical (upright or slightly inclined from the vertical) transportation of plate-like substrates, at only one of the two ends of the transportation device. A plurality of transportation wheels can also be mounted, for example by way of one end, in a bearing support, the bearing supports in each case having the bearings for a plurality of transportation wheels which are arranged one behind the other in the transportation direction of the substrates. As an alternative, the bearings can also be arranged in a chamber wall of the substrate treatment system. A transportation device of this kind is described, for example, in DE 10 2007 052 524 A1.

For reasons of linguistic simplicity, transportation rolls and transportation wheels of the above-described type will both be referred to as transportation rollers in the text which follows.

In known transportation devices, the transportation rollers are actively driven, that is to say a drive device, for example an electric motor, is provided, this drive device driving a plurality of transportation rollers which are coupled by mechanical transmission means, for example chains, toothed belts, vertical shafts or the like. The transportation rollers can be coupled to one another inside or outside the system chamber.

Coupling the transportation rollers using a common transmission means has the advantage that only one drive device is required. However, the known transmission means are subject to mechanical wear. Furthermore, the length of the transmission means changes as temperatures change and there is a risk of the process atmosphere being contaminated by the transmission means.

Furthermore, actuation of the transportation rollers for producing various transportation speeds is made all the more difficult the more transportation rollers are coupled by a common transmission means in order to manage with a drive device for as many transportation rollers as possible.

This grouped coupling of the transportation rollers produces sections of the transportation device, the transportation rollers of these sections necessarily being actuated jointly. Differences in speed (for example for closing gaps between successive substrates) are not possible within the group, but rather only between different sections of the transportation device. This is reflected in the overall length of the substrate treatment system.

In order to adjust speed, so-called passing bands are fitted in the case of known substrate treatment systems, the substrates being changed from the speed of the previous section of the transportation device to the speed of the following section of the transportation device on the passing bands. Additional installation space is also required for this purpose, this installation space increasing the overall length of the substrate treatment system.

Proceeding from this prior art, an aspect of the present invention is to improve known continuous substrate treatment systems.

This aspect is achieved by a substrate treatment system having the features of the present invention. Refinements and developments are disclosed in the following description.

BRIEF SUMMARY OF THE INVENTION

In the case of a substrate treatment system for treating substrates, for example in a continuous process, which comprises a system chamber, which is delimited by chamber walls and can have an entry lock and an exit lock, and also at least a substrate treatment device and a transportation device inside the system chamber, the transportation device having an arrangement of transportation rollers, which are arranged one behind the other in the transportation direction, for the vertical or horizontal transportation of substrates, it is proposed that, at least in the case of a first group of transportation rollers which are arranged immediately one behind the other, each transportation roller of this group has its own drive device. It goes without saying that provision can also be made for all the transportation rollers of the transportation device to each have their own drive device.

According to one refinement, the drive devices of the first group of transportation rollers can be actuated separately from the drive device or devices of a second group of transportation rollers. For this purpose, it is sufficient for all the drive devices of the first group to be able to be actuated together.

As an alternative or in addition, provision may be made for the drive devices of the first group of transportation rollers to be able to be actuated individually. As a result, it is possible to determine the speed of each individual transportation roller. In this way, the rollers which are connected by a substrate which is to be transported can in each case be actuated with a common speed profile, while other rollers of the same field can be actuated with different speed profiles, as a result of which, for example, the distance between substrates in the transportation direction can be changed. In this case, the partial quantity of rollers which are connected by a substrate changes continuously during the transportation process.

In a first development, the drive devices of the first group of transportation rollers are arranged inside the system chamber. For this purpose, vacuum-resistant electric motors with or without a gear mechanism can be used, for example. In this way, no rotary leadthroughs are required in order to transmit the torque from the outside, into the system chamber, to the transportation rollers.

A second development makes provision for the drive devices of the first group of transportation rollers to be arranged outside the system chamber and the torque to be transmitted to the respective transportation roller through rotary leadthroughs. This is particularly advantageous for substrate treatment operations under vacuum or at high temperatures or in aggressive atmospheres.

According to a third development, the rotor of the drive device is arranged under the pressure conditions prevailing in the system chamber and the stator is arranged outside the pressure conditions prevailing in the system chamber. In the simplest case, the rotor is arranged inside the system chamber, the stator is arranged outside the system chamber, and the rotor is driven by induction through a chamber wall.

According to one refinement, provision may be made, for example, for the drive device to have a separating element which hermetically separates the rotor and the stator of the drive device from one another and which is connected to a chamber wall of the system chamber in a gas-tight manner. As a result, no shaft seals are required; there is no risk of leakage. In this case, the separating element can be connected to the chamber wall in a cohesive manner, for example by welding, or can be flange-connected to and sealed off from the chamber wall in a force-fitting manner, for example by means of screw connections, or can be mounted in some other way.

In the process, the separating element can extend outwards or inwards from the chamber wall, that is to say the separating element forms a projection or recess in the chamber wall, depending on the design of the chamber wall. The separating element can also be designed in one plane, for example parallel to the chamber wall.

In the case of a projection, the rotor is arranged at least partially in the interior of the projection, and the stator is arranged on the outside of the projection. The separating element is advantageously produced from a non-magnetic material. The stator, which is arranged on the outside of the projection, generates an alternating electromagnetic field which drives the rotor which is arranged in the projection. In this case, the rotor can be, for example, of bell-like design.

In the case of a recess, the stator is arranged at least partially in the interior of the recess and the rotor is arranged on the outside of the said recess. In this case, the recess can additionally be designed such that it has an indentation which the rotor at least partially enters. For example, the rotor can be designed as a disc which is mounted on the transportation roller. A disc-like rotor of this kind can also have teeth or/and openings over its circumference. If the recess has an indentation which the rotor enters, the rotor will be surrounded by the stator in this region.

BRIEF DESCRIPTION OF THE DRAWING FIGURES

Figure 2:
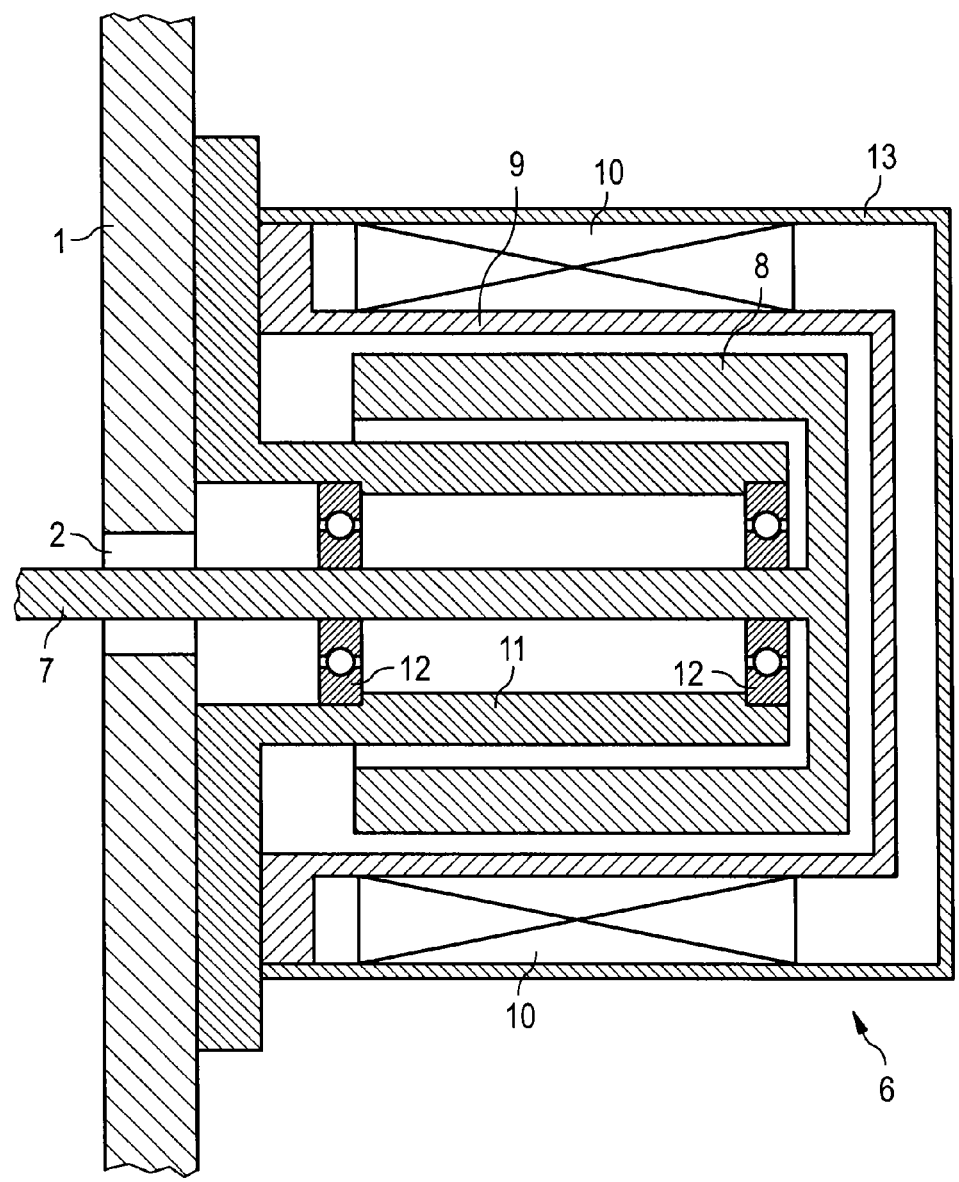
Figure 3:
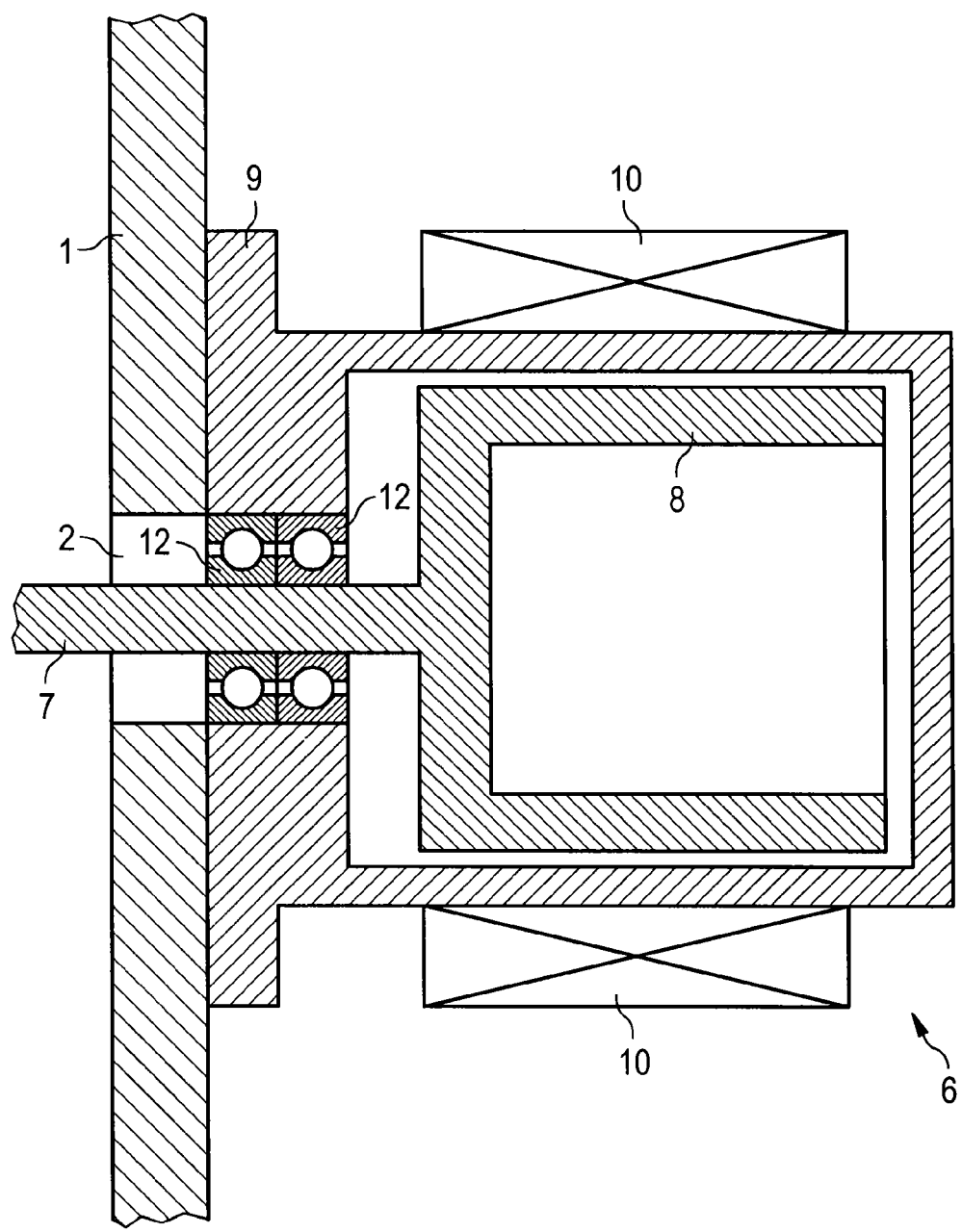
Figure 4:
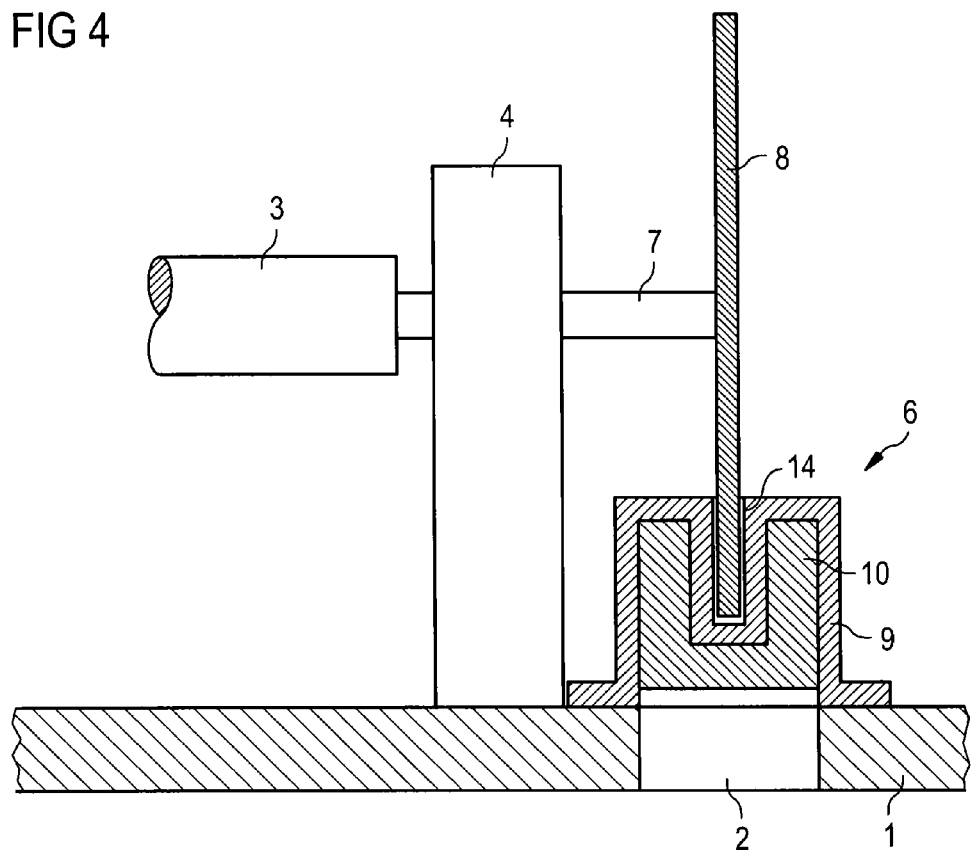
Figure 5:
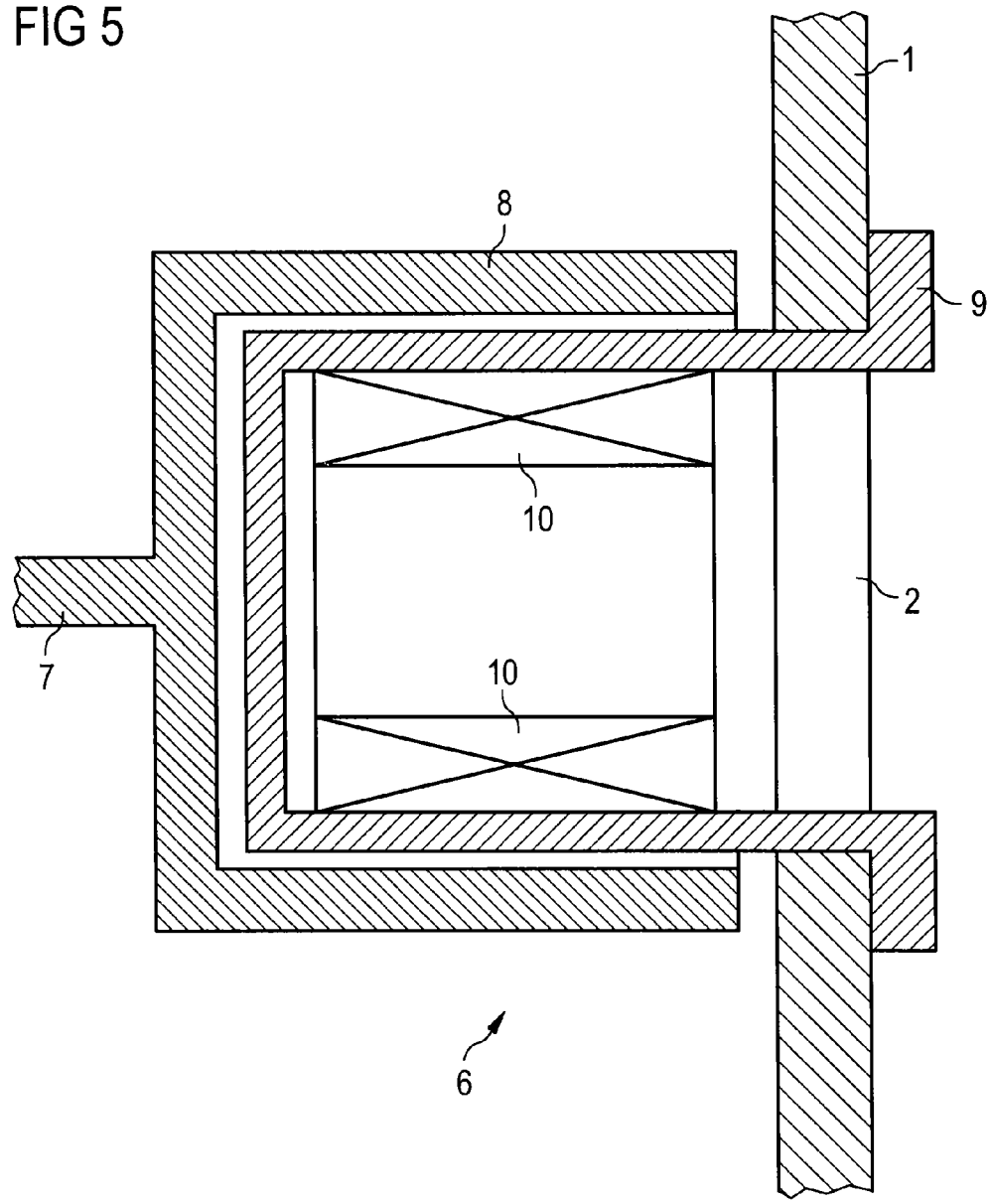

The substrate treatment system will be described in greater detail below with reference to exemplary embodiments and associated drawings, in which FIG. 1 shows a first exemplary embodiment for directly driving a transportation roller, FIG. 2 shows a first exemplary embodiment of a drive device according to FIG. 1, FIG. 3 shows a second exemplary embodiment of a drive device according to FIG. 1, FIG. 4 shows a second exemplary embodiment for directly driving a transportation roller, with a third exemplary embodiment of a drive device, and FIG. 5 shows a fourth exemplary embodiment of a drive device.

Figure 6:
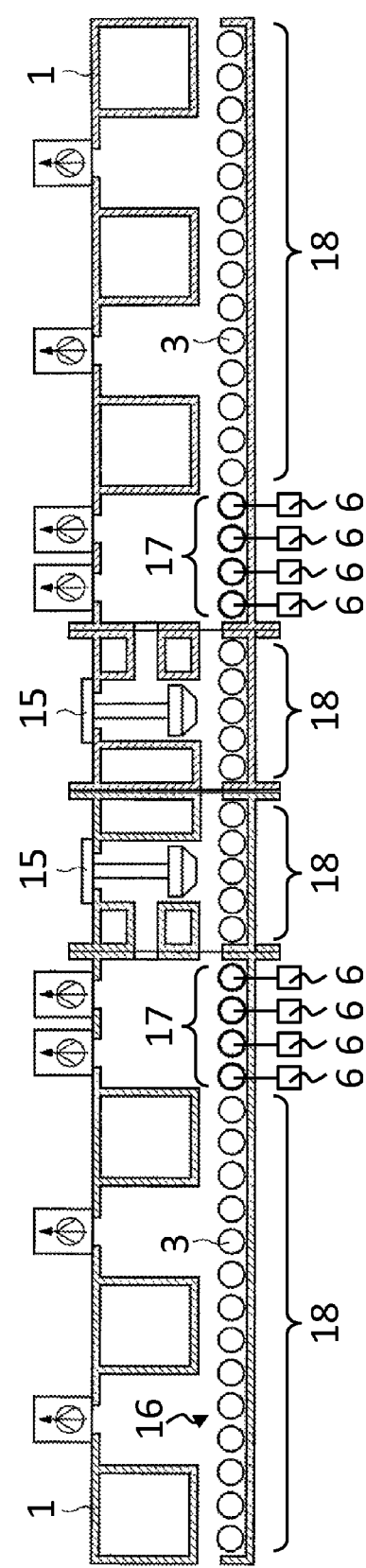

FIG. 6 illustrates a substrate treatment system in accordance with the principles of the present invention.

All the exemplary embodiments relate to substrate treatment systems for treating substrates in a continuous process, the substrate treatment systems, as illustrated in FIG. 6, having a system chamber, which is delimited by chamber walls 1 and has an entry lock and an exit lock, and also at least a substrate treatment device 15 and a transportation device 16 inside the system chamber, the transportation device having an arrangement of transportation rollers 3, which are arranged one behind the other in the transportation direction, for the vertical or horizontal transportation of substrates, in which a plurality of transportation rollers 3, which are arranged immediately one behind the other in a first group 17 disposed between two second groups 18 of jointly actuated transportation rollers, each have their own drive device 6. The figures are highly schematic and are intended only to illustrate how the drive devices 6 are each operatively connected to a transportation roller 3.

FIG. 1 illustrates a transportation device in which roll-like transportation rollers 3 are each rotatably mounted in a transportation roller bearing 4. A rotor shaft 7 which extends outwards through an opening 2 in the chamber wall 1 is fixed to the end of the transportation roller 3 by means of a clutch 5. A drive device 6 is fixed to the outside of the chamber wall 1.

FIG. 2 illustrates a first exemplary embodiment of the drive device 6.

Two rotor bearings 12 are arranged in a bearing housing 11, the rotor shaft 7 which projects through the opening 2 in the chamber wall 1 being rotatably mounted in the rotor bearings. The actual rotor 8, which is of bell-like design, is situated at the end of the rotor shaft 7. The rotor 8 is enclosed by a separating element 9 which is likewise of bell-like design. The bearing housing 11, the rotor 8 and the separating element 9 each have an annular cross section.

The stator, more precisely the stator windings 10 which generate an electromagnetic field during operation of the drive device, is arranged on the outside of the separating element 9. The separating element 9, together with the stator windings 10, forms the stator because the separating element 9 receives the reaction torque and passes it to the chamber wall 1. It goes without saying that it would likewise be possible to firmly connect the stator windings 10 to the outer housing 13, so that the stator windings 10 and the outer housing 13 form the stator.

The separating element 9 extends outwards from the chamber wall 1, that is to say it forms a projection on the chamber wall 1. The separating element 9 is connected to the chamber wall 1 in a gas-tight manner by means of the bearing housing 11 and hermetically separates the rotor 8 from the stator 10, so that the rotor 8 of the drive device 6 is arranged under the pressure conditions prevailing in the system chamber and the stator 10 is arranged outside the pressure conditions prevailing in the system chamber.

FIG. 3 illustrates a second exemplary embodiment of the drive device 6.

Two rotor bearings 12 are arranged in a separating element 9, the rotor shaft 7 being rotatably mounted in the rotor bearings and projecting through the opening 2 in the chamber wall 1. The actual rotor 8, which is of bell-like design, is situated at the end of the rotor shaft 7. The rotor 8 is enclosed by a separating element 9 which is likewise of bell-like design. The bearing housing 11, the rotor 8 and the separating element 9 each have an annular cross section.

The stator, more precisely the stator windings 10 which generate an electromagnetic field during operation of the drive device, is arranged on the outside of the separating element 9. The separating element 9, together with the stator windings 10, forms the stator because the separating element 9 receives the reaction torque and passes it to the chamber wall 1.

The separating element 9 extends outwards from the chamber wall 1, that is to say it forms a projection on the chamber wall 1. The separating element 9 is connected to the chamber wall 1 in a gas-tight manner and hermetically separates the rotor 8 from the stator 10, so that the rotor 8 of the drive device 6 is arranged under the pressure conditions prevailing in the system chamber and the stator 10 is arranged outside the pressure conditions prevailing in the system chamber.

FIG. 4 illustrates a transportation device in which roll-like transportation rollers 3 are each rotatably mounted in a transportation roller bearing 4. A rotor shaft 7 is fixed to the end of the transportation roller 3, a disc-like rotor 8 being arranged at the end of the said rotor shaft.

A separating element 9 which forms a recess, that is to say projects into the system chamber, is fixed to the inside of the chamber wall 1. The stator windings 10 are arranged in the interior of the separating element 9. The separating element 9 and the stator windings 10 have an indentation 14 which the lower section of the rotor 8 enters, so that this section is surrounded by the stator windings 10.

FIG. 5 illustrates a fourth exemplary embodiment of the drive device 6, in which the separating element 9 likewise forms a recess.

However, in this case, the separating element 9 is again—as in the exemplary embodiments of FIGS. 1 to 3—arranged in the axial extent of the transportation roller 3. The separating element 9 is of bell-like design. It is mounted on the outside of the chamber wall 1 in a gas-tight manner and projects into the system chamber through the opening 2 in the chamber wall 1. A rotor 8, which is once again in the form of a bell and surrounds the separating element 9, is arranged at the end of the rotor shaft 7. The stator windings 10 are arranged in the interior of the separating element 9, so that the rotor 8 of the drive device 6 is arranged under the pressure conditions prevailing in the system chamber and the stator 10 is arranged outside the pressure conditions prevailing in the system chamber.

The invention claimed is:

1. Substrate treatment system for treating substrates, comprising a system chamber delimited by chamber walls, at least one substrate treatment device, and a transportation device inside the system chamber, the transportation device having an arrangement of transportation rollers arranged one behind another in a transportation direction, for transportation of substrates, wherein the arrangement of transportation rollers is subdivided into at least three groups of transportation rollers, at least in a first group of the transportation rollers arranged immediately one behind another, which first group is disposed between two second groups of jointly actuated transportation rollers, each transportation roller has a respective drive device, and wherein drive devices of the first group of transportation rollers are arranged inside the system chamber.

2. The substrate treatment system according to claim 1, wherein drive devices of the first group of transportation rollers are actuated separately from a drive device or drive devices of a second group of the transportation rollers.

3. The substrate treatment system according to claim 1, wherein drive devices of the first group of transportation rollers are actuated individually.

4. The substrate treatment system for treating substrates, comprising a system chamber delimited by chamber walls, at least one substrate treatment device, and a transportation device inside the system chamber, the transportation device having an arrangement of transportation rollers arranged one behind another in a transportation direction, for transportation of substrates, wherein the arrangement of transportation rollers is subdivided into at least three groups of transportation rollers, at least in a first group of the transportation rollers arranged immediately one behind another, which first group is disposed between two second groups of jointly actuated transportation rollers, each transportation roller has a respective drive device, wherein a rotor of the drive device is arranged under pressure conditions prevailing in the system chamber and a stator of the drive device is arranged outside the pressure conditions prevailing in the system chamber.

5. The substrate treatment system according to claim 4, wherein the drive device has a separating element hermetically separating the rotor and the stator of the drive device from one another and the separating element is connected to a chamber wall of the system chamber in a gas-tight manner.

6. The substrate treatment system according to claim 5, wherein the separating element extends outwards from the chamber wall forming a projection, the rotor is arranged at least partially in an interior of the projection, and the stator is arranged outside the projection.

7. The substrate treatment system according to claim 5, wherein the separating element extends inwards from the chamber wall forming a recess, and the stator is arranged at least partially in the recess.

8. The substrate treatment system according to claim 7, wherein the separating element has an indentation which the rotor at least partially enters.

9. The substrate treatment system according to claim 4, wherein the rotor has a bell-like form with an annular cross-section extending from an end of a rotor shaft.

10. The substrate treatment system according to claim 4, wherein the rotor comprises a disc at an end of a rotor shaft.

11. The substrate treatment system according to claim 8, wherein the rotor comprises a disc at an end of a rotor shaft.

12. The substrate treatment system according to claim 4, wherein drive devices of the first group of transportation rollers are actuated separately from a drive device or drive devices of a second group of the transportation rollers.

13. The substrate treatment system according to claim 4, wherein drive devices of the first group of transportation rollers are actuated individually.

* * * * *